United States Patent
Wu

(10) Patent No.: US 8,860,219 B2
(45) Date of Patent: Oct. 14, 2014

(54) CHIP ASSEMBLY AND CHIP ASSEMBLING METHOD

(75) Inventor: Kai-Wen Wu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/559,621

(22) Filed: Jul. 27, 2012

(65) Prior Publication Data

US 2013/0285239 A1    Oct. 31, 2013

(30) Foreign Application Priority Data

Apr. 25, 2012   (TW) .............................. 101114620 A

(51) Int. Cl.
    *H01L 23/48*   (2006.01)
(52) U.S. Cl.
    USPC .................................. 257/738; 257/E23.069
(58) Field of Classification Search
    CPC .................................................. H01L 2924/142
    USPC ................................................... 257/735, 736
    See application file for complete search history.

(56) References Cited

U.S. PATENT DOCUMENTS

| 6,930,381 B1 * | 8/2005 | Cornelius ..................... 257/692 |
| 8,063,318 B2 * | 11/2011 | Williams et al. .............. 174/523 |
| 2012/0228759 A1 * | 9/2012 | Fan ............................... 257/737 |

* cited by examiner

*Primary Examiner* — Chandra Chaudhari
(74) *Attorney, Agent, or Firm* — Novak Druce Connolly Bove + Quigg LLP

(57) ABSTRACT

A chip assembly includes a PCB and a chip positioned on the PCB. The PCB includes a number of first bonding pads. Each bonding pad includes two soldering balls formed thereon. The chip includes a number of second bonding pads, and each second bonding pad corresponds to a respective first bonding pad. The two soldering balls of each first bonding pad are electrically connected to a corresponding second bonding pad via two bonding wires, and the bonding wires are bonded to the second corresponding bonding pad by a wedge bonding manner.

5 Claims, 2 Drawing Sheets

CHIP ASSEMBLY AND CHIP ASSEMBLING METHOD

BACKGROUND

1. Technical Field

The present disclosure relates to a chip assembly and a method for the chip assembly.

2. Description of Related Art

Chip assemblies include a printed circuit board (PCB) and at least one chip positioned on the PCB. To achieve predetermined functions, bonding wires are utilized to electrically connect the chip to the PCB and transmit high-frequency signals between the chip and the PCB. However, a large inductance is introduced and increases signal loss at the bonding wires when transmitting the high-frequency signals. In addition, with the development of technology, the chip becomes increasingly smaller and thus more difficult to bond bonding wires thereto.

What is needed therefore is a chip assembly and a chip assembling method addressing the limitations described.

BRIEF DESCRIPTION OF THE DRAWINGS

The components of the drawings are not necessarily drawn to scale, the emphasis instead being placed upon clearly illustrating the principles of the embodiments of the present disclosure. Moreover, in the drawings, like reference numerals designate corresponding parts throughout several views.

DETAILED DESCRIPTION

Figure 1:
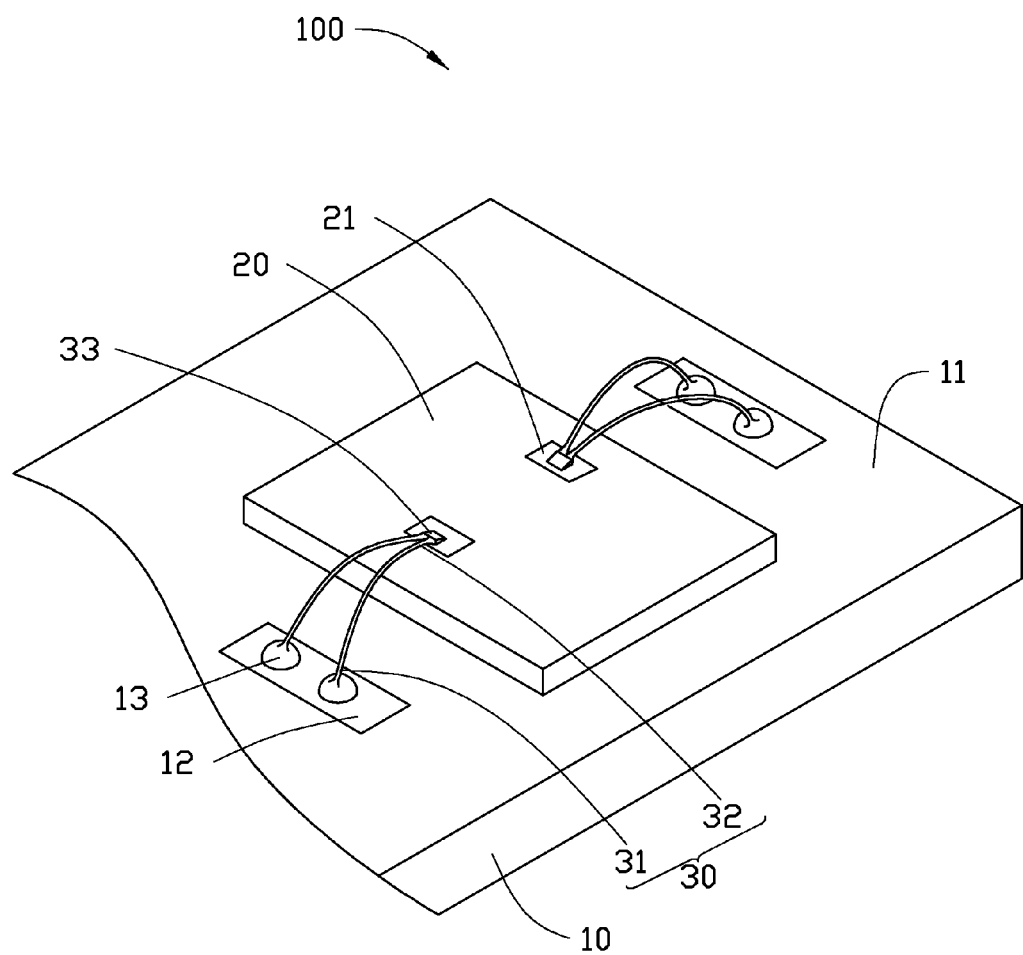
FIG. 1 is a schematic view of a chip assembly, according to an embodiment of the present disclosure.

Referring to FIG. 1, a chip assembly 100, according to an exemplary embodiment, is shown. The chip assembly 100 includes a printed circuit board (PCB) 10, a chip 20 positioned on the PCB 10, and a number of bonding wires 30.

The PCB 10 includes a supporting surface 11 for supporting the chip 20 and a number of first bonding pads 12 formed on the supporting surface 11. The first bonding pads 12 connect to circuits (not shown) formed in the PCB 10. Each first bonding pad 12 includes two soldering balls 13 formed thereon. The two soldering balls 13 are spaced from each other. In the embodiment, a distance between one of the two soldering balls 13 and the chip 20 is substantially equal to a distance between the other of the two soldering balls 13 and the chip 20.

The chip 20 is substantially rectangular-shaped. The chip 20 includes a number of second bonding pads 21, each of which corresponds to a first bonding pad 12.

In the embodiment, the number of the first bonding pads 12 is two, and the number of the second bonding pads 21 is two. In other embodiments, the number of the first bonding pads 12 and the number of the second bonding pads 12 can be changed according to different demands.

The bonding wires 30 electrically connect the chip 20 to the PCB 10. Each bonding wire 30 includes a beginning end 31 and an opposite ending end 32 between the beginning end 31 and the ending end 32. The beginning end 31 is bonded first, and the ending end 32 is bonded last. Each first bonding pad 12 is electrically connected to the corresponding second bonding pad 21 via two bonding wires 30. The two bonding wires 30 intersect to each other at the second bonding pad 21. In detail, the beginning end 31 of one bonding wire 30 is bonded on one of the soldering balls 13, and the ending end 32 of the bonding wire 30 is bonded on the corresponding second bonding pad 21; the beginning end 31 of the other bonding wire 30 is bonded on the other of the soldering balls 13, and the ending end 31 of the other bonding wire 30 is bonded on the corresponding second bonding pad 21. The ending ends 32 of the bonding wires 30 are bonding on the second bonding pad 21 by a wedge bonding manner The ending ends 32 of the two bonding wires 30 are bonded at a same position of the second bonding pad 21. The ending ends 32 form a wedge portion 33 on the second bonding pad 21.

The soldering balls 13 and the bonding wires 30 are made from a material(s) with high conductivity. In the embodiment, the soldering balls 13 and the bonding wires 30 are made from gold.

FIG. 1 only shows a chip 20 positioned on the PCB 10. However, the number of the chip on the PCB can be more than one, and the chips may have different heights. The chips also can be connected to each other by bonding wires similar as the bonding wires 30.

The chip assembly 100 electrically connects a first bonding pad 12 to a corresponding second bonding pad 21 via two shunt-wound bonding wires 30, thus an inductance between the first bonding pad 12 and the second bonding pad 21 is decreased.

Figure 2:
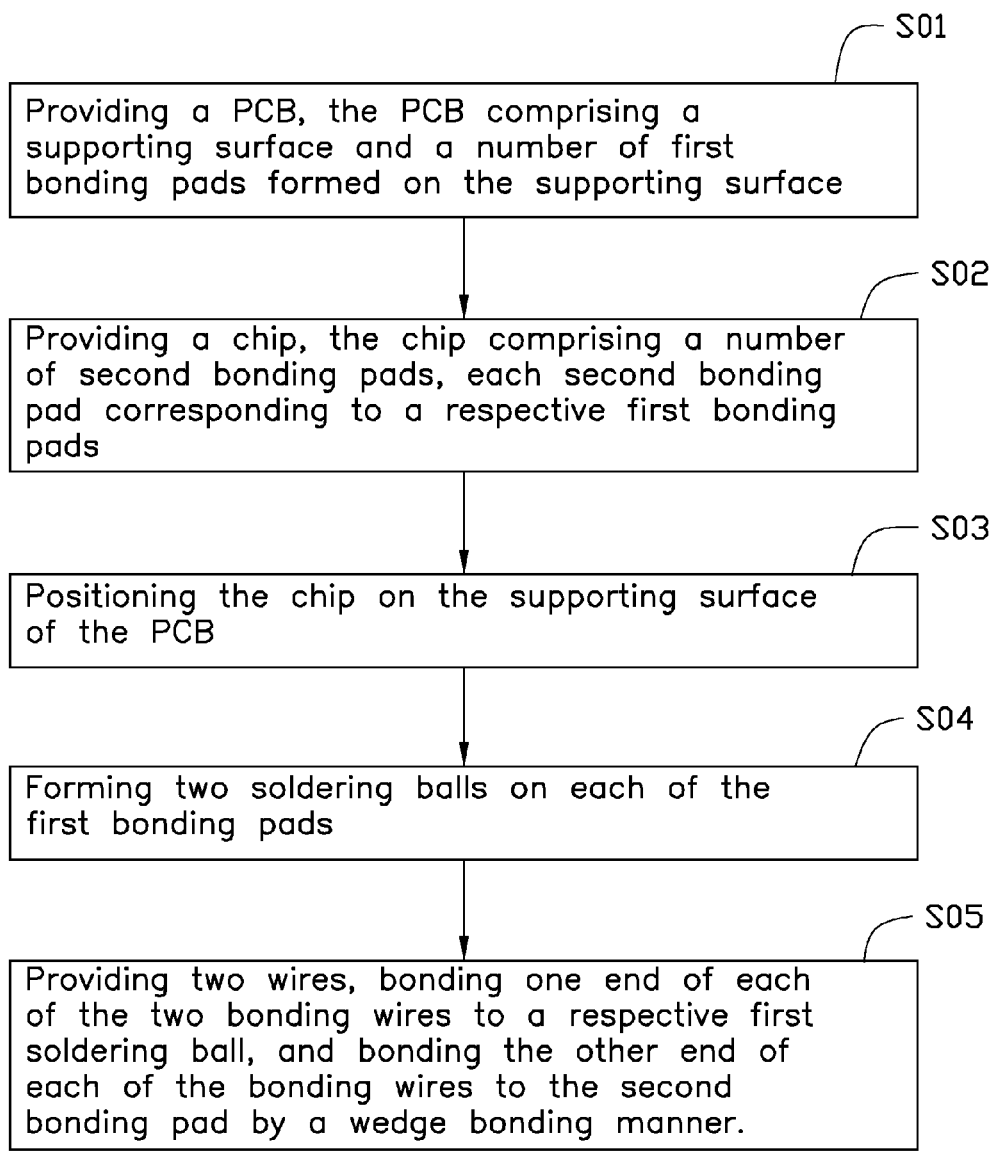
FIG. 2 is a flowchart of a chip assembling method, according to another embodiment of the present disclosure.

Referring to FIG. 2, an embodiment of a chip assembling method is shown. The chip assembling method includes the following steps.

In step S01, a PCB is provided. The PCB includes a supporting surface and a number of first bonding pads formed on the supporting surface.

In step S02, a chip is provided. The chip includes a number of second bonding pads, and each second bonding pad corresponds to a respective first bonding pad.

In step S03, the chip is fixedly positioned on the supporting surface of the PCB.

In step S04, two soldering balls are formed on each of the first bonding pads.

In step S05, two bonding wires are provided. One end of each of the bonding wires is bonded to a respective soldering ball, and the other end of each of the bonding wires is bonded to the respective second bonding pad by a wedge bonding manner. In this embodiment, the ends of the bonding wires are bonded at the same position of the respective second bonding pad.

It should be noted that the above chip assembling method just described how to electrically connect a first bonding pad to a corresponding second bonding pad, the other first bonding pads can be electrically connected to the corresponding second bonding pads by a similar method.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A chip assembly, comprising:
    a PCB comprising a plurality of first bonding pads, each first bonding pad comprising two soldering balls positioned thereon; and
    a chip positioned on the PCB, the chip comprising a plurality of second bonding pads, each second bonding pad corresponding to a respective one of the first bonding pads;

wherein the two soldering balls of each first bonding pad are electrically connected to a corresponding second bonding pad via two bonding wires, the two bonding wires are bonded to the corresponding second bonding pad by a wedge bonding manner.

2. The chip assembly of claim 1, wherein a distance between one of the two soldering balls and the chip is substantially equal to a distance between the other of the two soldering balls and the chip.

3. The chip assembly of claim 1, wherein the bonding wires are bonded to a same position of the corresponding second bonding pad.

4. The chip assembly of claim 3, wherein ends of the bonding wires bonded to the corresponding second bonding pad form a wedge portion.

5. The chip assembly of claim 1, wherein the soldering balls and the bonding wires are made from gold.

* * * * *